US012738914B2

United States Patent
(12) United States Patent
Yamaguchi et al.

(10) Patent No.: US 12,738,914 B2
(45) Date of Patent: Sep. 15, 2026

(54) METHOD OF MANUFACTURING VIBRATION ELEMENT

(71) Applicant: SEIKO EPSON CORPORATION, Tokyo (JP)

(72) Inventors: Keiichi Yamaguchi, Ina (JP); Hiyori Sakata, Minowa (JP); Shigeru Shiraishi, Ina (JP); Ryuta Nishizawa, Nagano (JP)

(73) Assignee: SEIKO EPSON CORPORATION (JP)

(*) Notice: Subject to any disclaimer, the term of this patent is extended or adjusted under 35 U.S.C. 154(b) by 695 days.

(21) Appl. No.: 17/953,916

(22) Filed: Sep. 27, 2022

(65) Prior Publication Data

US 2023/0097025 A1 Mar. 30, 2023

(30) Foreign Application Priority Data

Sep. 28, 2021 (JP) ................................ 2021-157613

(51) Int. Cl.
*H03H 3/02* (2006.01)
*H03H 9/215* (2006.01)

(52) U.S. Cl.
CPC .............. *H03H 3/02* (2013.01); *H03H 9/215* (2013.01); *H03H 2003/026* (2013.01)

(58) Field of Classification Search
CPC ........ H10N 30/082; H10N 30/06; H03H 9/21; H03H 9/215; H03H 2003/026; H03H 3/02
See application file for complete search history.

(56) References Cited

U.S. PATENT DOCUMENTS 8,156,621 B2 * 4/2012 Iwai .......................... C23F 1/14 29/25.35
10,072,928 B2 * 9/2018 Ishii .................... H10N 30/302
(Continued)

FOREIGN PATENT DOCUMENTS

JP 2007-013382 A 1/2007
JP 2007329879 A * 12/2007
(Continued)

OTHER PUBLICATIONS

Translation of JP-2007329879-A (Year: 2007).*
Translation of JP-2010227817-A (Year: 2010).*
Translation of WO-2006030900-A1 (Year: 2006).*

*Primary Examiner* — Jeffrey T Carley
(74) *Attorney, Agent, or Firm* — Harness, Dickey & Pierce, P.L.C.

(57) ABSTRACT

A method of manufacturing a vibration element includes: a protective film forming step of forming a protective film on a first substrate surface of a crystal substrate; and a dry etching step of dry-etching the crystal substrate via the protective film. The protective film satisfies a relationship of T1<T2<T3, in which T1 is a thickness of the protective film in an inter-arm region positioned between a first vibration arm forming region in which a first vibration arm is formed and a second vibration arm forming region in which a second vibration arm is formed, T2 is a thickness of the protective film in a groove forming region in which a groove is formed, and T3 is a thickness of the protective film in a region of the first vibration arm forming region and the second vibration arm forming region excluding the groove forming region.

7 Claims, 14 Drawing Sheets

(56) References Cited

U.S. PATENT DOCUMENTS

| | | | | |
|---|---|---|---|---|
| 10,128,430 | B2 * | 11/2018 | Yamada | H03H 9/0547 |
| 10,788,470 | B2 * | 9/2020 | Toffoli | G01N 30/95 |
| 2003/0071542 | A1 * | 4/2003 | Satoh | H03H 3/08<br>310/367 |
| 2007/0228895 | A1 * | 10/2007 | Yamamoto | H03H 9/215<br>216/13 |
| 2008/0209703 | A1 | 9/2008 | Iwai | |
| 2009/0152994 | A1 * | 6/2009 | Numata | H03H 9/1021<br>29/25.35 |
| 2009/0206704 | A1 * | 8/2009 | Kitamura | H03H 9/0547<br>310/357 |
| 2010/0207495 | A1 * | 8/2010 | Kikushima | H03H 9/1021<br>310/370 |
| 2010/0320875 | A1 * | 12/2010 | Takizawa | H03H 9/176<br>310/357 |
| 2016/0035614 | A1 * | 2/2016 | Purayath | H10D 64/035<br>438/421 |
| 2017/0126200 | A1 * | 5/2017 | Matsuo | H03H 3/02 |

FOREIGN PATENT DOCUMENTS

| | | | | |
|---|---|---|---|---|
| JP | 2008-205657 | A | 9/2008 | |
| JP | 2010227817 | A * | 10/2010 | H01L 41/29 |
| JP | 2013-175933 | A | 9/2013 | |
| JP | 2018-148380 | A | 9/2018 | |
| WO | WO-2006030900 | A1 * | 3/2006 | H03H 3/04 |

* cited by examiner

METHOD OF MANUFACTURING VIBRATION ELEMENT

The present application is based on, and claims priority from JP Application Serial Number 2021-157613, filed Sep. 28, 2021, the disclosure of which is hereby incorporated by reference herein in its entirety.

BACKGROUND

1. Technical Field

The present disclosure relates to a method of manufacturing a vibration element.

2. Related Art

JP-A-2013-175933 describes a method of forming a tuning-fork type vibrator having a bottomed groove in a vibration arm by wet etching and dry etching. In this manufacturing method, a crystal substrate is wet-etched to form an outer shape of the tuning-fork type vibrator, and then the groove is formed by the dry etching.

JP-A-2007-013382 describes a method of forming a tuning-fork type vibrator having a bottomed groove in a vibration arm by dry etching. In this manufacturing method, when a substrate made of a piezoelectric material is dry-etched, a width of the groove is narrowed with respect to a width between a pair of vibration arms such that, by using a micro-loading effect, an etching depth of the groove is made shallower than an etching depth between the pair of vibration arms, and the groove and an outer shape of the vibrator are collectively formed.

In the manufacturing method of JP-A-2013-175933, since the wet etching for forming the outer shape and the dry etching for forming the groove are separate steps, the manufacturing step is complicated, and positional deviation of the groove with respect to the outer shape is likely to occur. Therefore, there is a problem in that the vibration element according to this manufacturing method easily generates unnecessary vibration or the like.

On the other hand, in the manufacturing method of JP-A-2007-013382, since the outer shape and the groove are collectively formed in the same step, the above-described problem does not occur. However, in this manufacturing method, since the outer shape and the groove are collectively formed by using the micro-loading effect in the dry etching, there is a problem that setting of dimensions such as the width of the vibration arm and the width and depth of the groove is restricted, and the degree of freedom in design is low.

Therefore, there has been a demand for a method of manufacturing a vibration element capable of collectively forming an outer shape and a groove and having a high degree of freedom in design.

SUMMARY

A method of manufacturing a vibration element according to the present disclosure is a method of manufacturing a vibration element including a first vibration arm and a second vibration arm extending along a first direction and arranged side by side along a second direction intersecting the first direction. The first vibration arm and the second vibration arm each have a first surface and a second surface in a front and back relationship that are arranged side by side in a third direction intersecting the first direction and the second direction, and a bottomed groove opening to the first surface. The method includes: a preparation step of preparing a crystal substrate having a first substrate surface and a second substrate surface in a front and back relationship; a protective film forming step of forming a protective film on the first substrate surface; and a dry etching step of dry-etching the crystal substrate from a side on the first substrate surface via the protective film to form the first surface, the groove, and outer shapes of the first vibration arm and the second vibration arm. The protective film satisfies a relationship of T1<T2<T3, in which T1 is a thickness of the protective film along the third direction in an inter-arm region positioned between a first vibration arm forming region in which the first vibration arm is formed and a second vibration arm forming region in which the second vibration arm is formed, T2 is a thickness of the protective film along the third direction in a groove forming region in which the groove is formed, and T3 is a thickness of the protective film along the third direction in a region of the first vibration arm forming region and the second vibration arm forming region excluding the groove forming region.

BRIEF DESCRIPTION OF THE DRAWINGS

FIG. 7 is a cross-sectional view showing a method of forming the protective film.

FIG. 13 is a plan view showing a modification of the vibration element.

DESCRIPTION OF EXEMPLARY EMBODIMENTS

1. First Embodiment

A method of manufacturing a vibration element 1 according to a first embodiment will be described.

First, a configuration of the vibration element 1 will be described with reference to FIGS. 1 and 2, and then the method of manufacturing the vibration element 1 will be described with reference to FIGS. 3 to 9.

Figure 3:
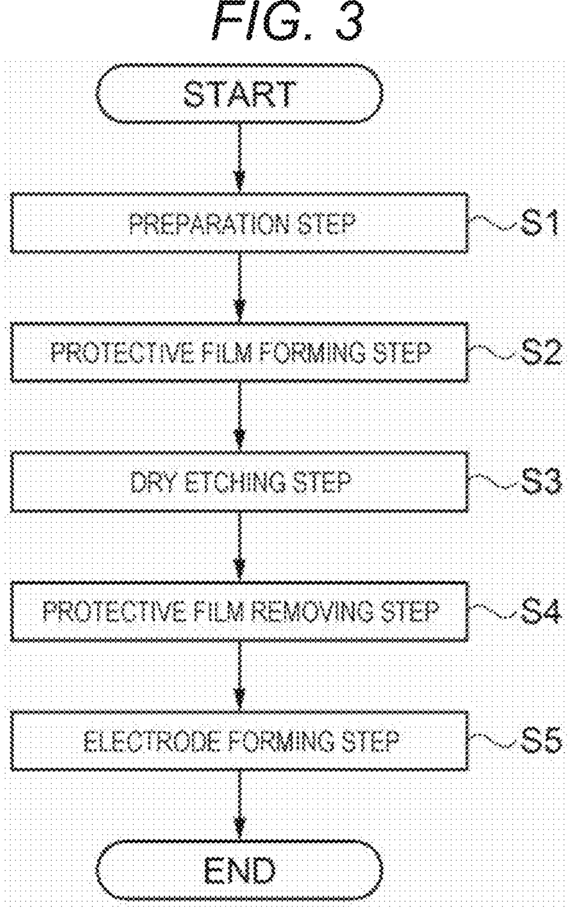
FIG. 3 is a diagram showing a step of manufacturing the vibration element according to the first embodiment.
Figure 6:
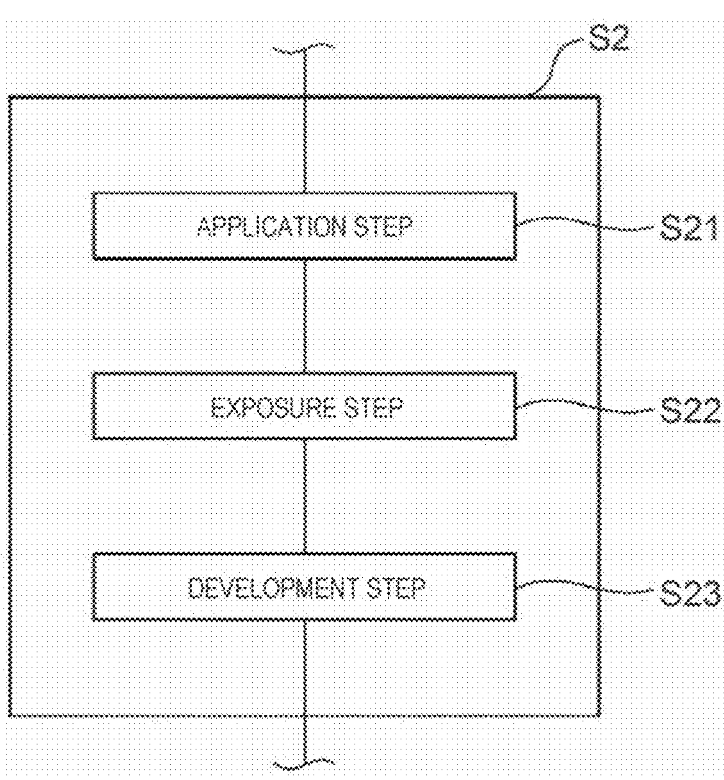
FIG. 6 is a diagram showing a step of forming a protective film.

For convenience of description, each figure except FIGS. 3 and 6 shows three axes orthogonal to each other, that is, an X axis, a Y axis, and a Z axis. In addition, a direction along the X axis as a second direction is also referred to as an X direction, a direction along the Y axis as a first direction is also referred to as a Y direction, and a direction along the Z axis as a third direction is also referred to as a Z direction. In addition, an arrow side of each axis is also referred to as a plus side, and an opposite side is also referred to as a minus side. In addition, the plus side in the Z direction is also referred to as "upper", and the minus side is also referred to as "lower". In addition, a plan view from the Z direction is also simply referred to as a "plan view". In addition, the X axis, the Y axis, and the Z axis correspond to crystal axes of a crystal, as will be described later.

Figure 1:
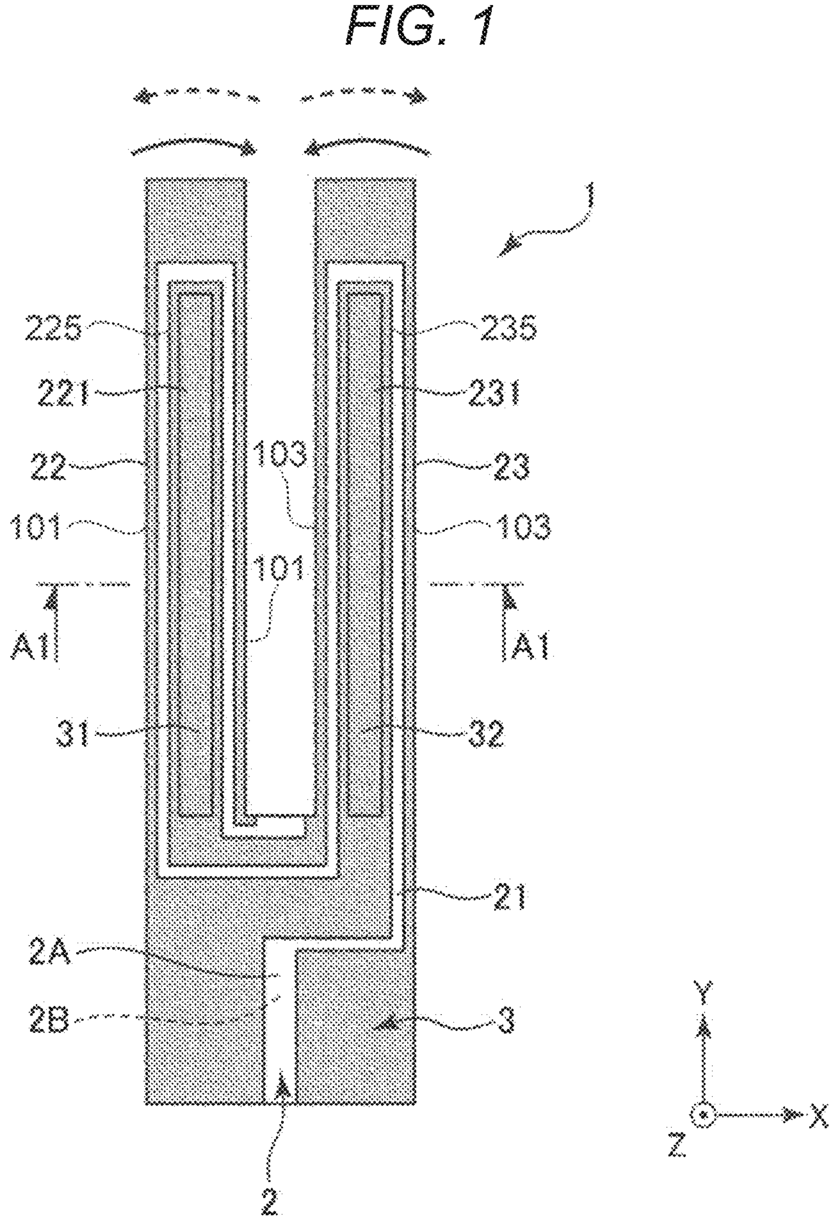
FIG. 1 is a plan view showing a vibration element according to a first embodiment.
Figure 2:
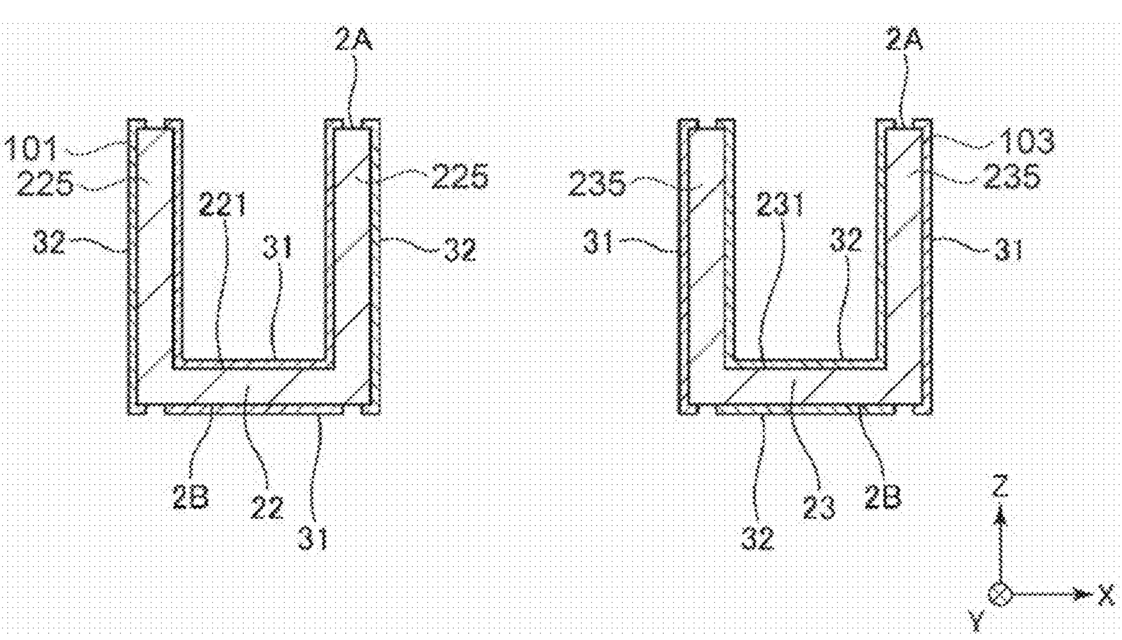
FIG. 2 is a cross-sectional view taken along a line A1-A1 in FIG. 1.

As shown in FIGS. 1 and 2, the vibration element 1 is a tuning-fork type vibration element, and includes a vibration substrate 2 and an electrode 3 formed on a surface of the vibration substrate 2.

The vibration substrate 2 is formed by patterning a Z-cut crystal substrate as a Z-cut crystal plate into a desired shape, has a spread in an X-Y plane defined by the X axis and the Y axis which are the crystal axes of the crystal, and has a thickness along the Z direction. The X axis is also referred to as an electrical axis, the Y axis is also referred to as a mechanical axis, and the Z axis is also referred to as an optical axis.

The vibration substrate 2 has a plate shape and has a first surface 2A and a second surface 2B which are arranged side by side in the Z direction in a front and back relationship with each other. In addition, the vibration substrate 2 includes a base portion 21, and a first vibration arm 22 and a second vibration arm 23 which extend from the base portion 21 along the Y direction and are arranged side by side along the X direction.

The first vibration arm 22 includes a bottomed groove 221 that opens to the first surface 2A, a bank portion 225 that defines the groove 221, and a side surface 101 that couples the first surface 2A and the second surface 2B. The bank portion 225 is a portion disposed on the first surface 2A so as to sandwich the groove 221 along the X direction in the plan view.

Similarly, the second vibration arm 23 includes a bottomed groove 231 that opens to the first surface 2A, a bank portion 235 that defines the groove 231, and a side surface 103 that couples the first surface 2A and the second surface 2B. The bank portion 235 is a portion disposed on the first surface 2A so as to sandwich the groove 231 along the X direction in the plan view.

The grooves 221 and 231 extend along the Y direction. In addition, the bank portions 225 and 235 are formed on both sides of the grooves 221 and 231 in the X direction, respectively, and extend along the Y direction. Therefore, each of the first vibration arm 22 and the second vibration arm 23 has a substantially U-shaped cross-sectional shape. Accordingly, the vibration element 1 has a reduced thermoelastic loss and excellent vibration characteristics.

The electrode 3 includes a signal electrode 31 and a ground electrode 32. The signal electrode 31 is disposed on the first surface 2A and the second surface 2B of the first vibration arm 22 and the side surface 103 of the second vibration arm 23. On the other hand, the ground electrode 32 is disposed on the side surface 101 of the first vibration arm 22 and the first surface 2A and the second surface 2B of the second vibration arm 23. When a drive signal is applied to the signal electrode 31 in a state where the ground electrode 32 is grounded, as shown by arrows in FIG. 1, the first vibration arm 22 and the second vibration arm 23 repeatedly approach and separate from each other to perform flexural vibration in the X direction.

The vibration element 1 is briefly described above.

Next, the method of manufacturing the vibration element 1 will be described. As shown in FIG. 3, the method of manufacturing the vibration element 1 includes: a preparation step S1 of preparing a crystal substrate 20 which is a base material of the vibration substrate 2; a protective film forming step S2 of forming a protective film 5 on a first substrate surface 20A of the crystal substrate 20; a dry etching step S3 of dry-etching the crystal substrate 20 from a side on the first substrate surface 20A via the protective film 5; a protective film removing step S4 of removing the protective film 5 remaining on the first substrate surface 20A of the crystal substrate 20; and an electrode forming step S5 of forming the electrode 3 on a surface of the vibration substrate 2 obtained by the above steps.

Hereinafter, each of these steps will be described in order.

Preparation Step S1

Figure 4:
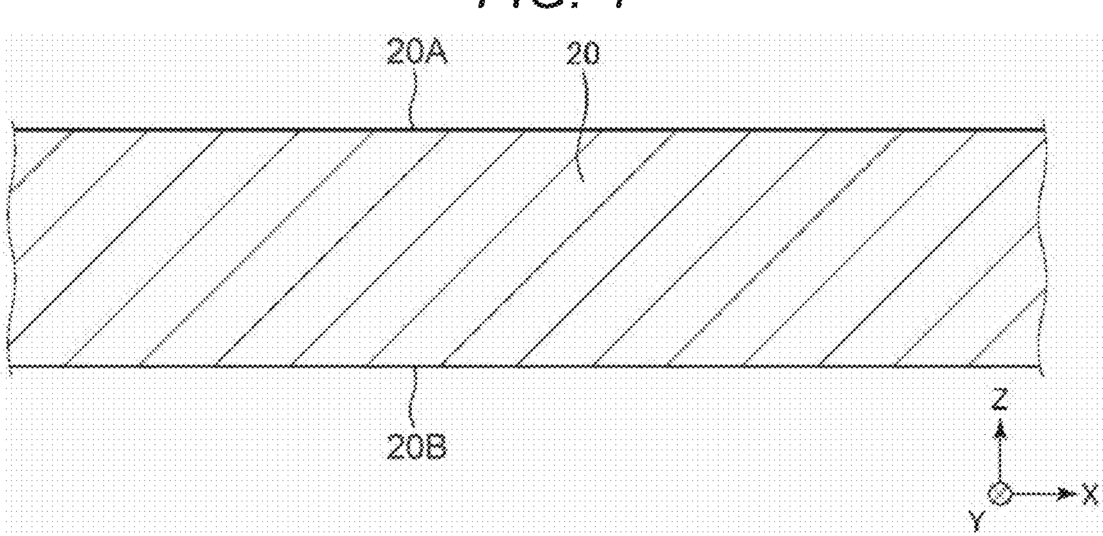
FIG. 4 is a cross-sectional view showing a method of manufacturing the vibration element.

As shown in FIG. 4, the crystal substrate 20, which is the base material of the vibration substrate 2, is prepared. A plurality of vibration elements 1 are collectively formed from the crystal substrate 20. The crystal substrate 20 has a plate shape, and has the first substrate surface 20A and a second substrate surface 20B which are arranged side by side in the Z direction in a front and back relationship with each other. The crystal substrate 20 is adjusted to a desired thickness by polishing processing such as lapping or polishing, and the first substrate surface 20A and the second substrate surface 20B are sufficiently smoothened. In addition, if necessary, the crystal substrate 20 may be subjected to a surface treatment by wet etching.

Protective Film Forming Step S2

Figure 5:
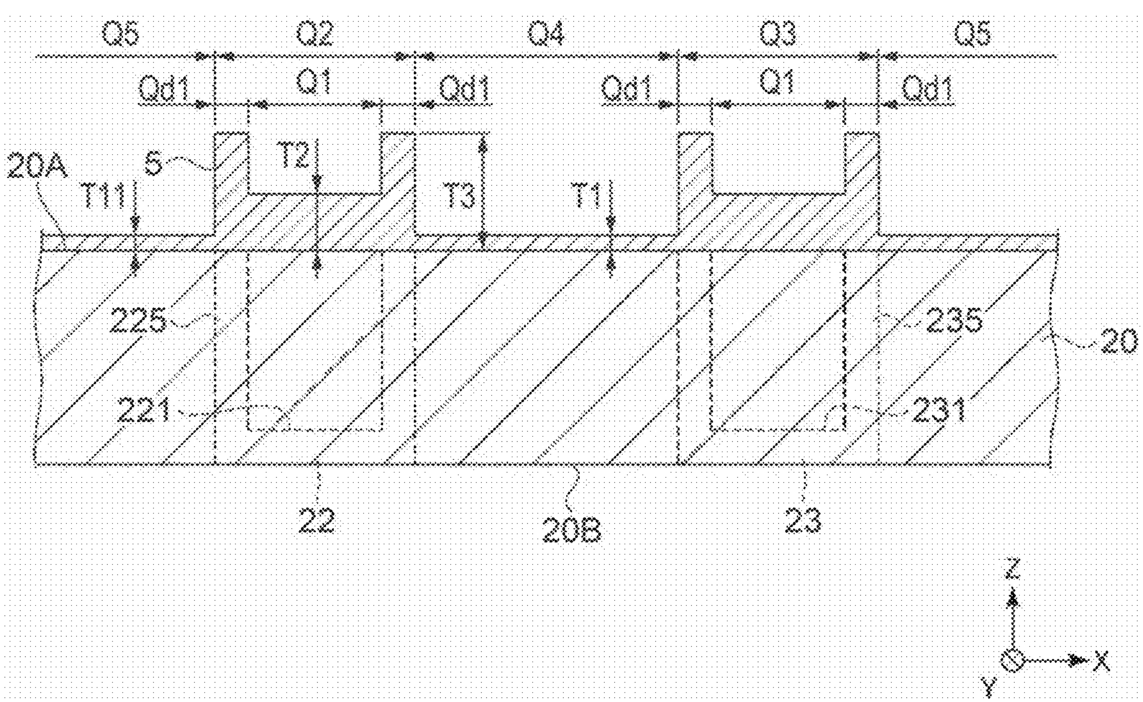
FIG. 5 is a cross-sectional view showing the method of manufacturing the vibration element.

As shown in FIG. 5, the protective film 5 is formed on the first substrate surface 20A of the crystal substrate 20.

The protective film 5 has a three-dimensional shape. The protective film 5 is formed of a protective material that is etched at a predetermined etching rate in the dry etching step S3 to be described later.

The crystal substrate 20 is etched from the side on the first substrate surface 20A of the crystal substrate 20 via the protective film 5 in the dry etching step S3 to be described later. That is, the etching of the first substrate surface 20A of the crystal substrate 20 is started after the protective film 5 is removed. Therefore, an etching depth of the crystal substrate 20 becomes deeper in a region in which the thickness of the protective film 5 along the Z direction is thin, and the etching depth of the crystal substrate 20 becomes shallower in a region in which the thickness of the protective film 5 along the Z direction is thick. In this way, the etching depth of the crystal substrate 20 can be controlled by adjusting the thickness of the protective film 5 along the Z direction.

A shape of the protective film 5 will be described in detail.

The protective film 5 is formed in a first vibration arm forming region Q2, a second vibration arm forming region Q3, an inter-arm region Q4, and an inter-element region Q5.

The first vibration arm forming region Q2 is a region in which the first vibration arm 22 is formed. The second vibration arm forming region Q3 is a region in which the second vibration arm 23 is formed. The inter-arm region Q4 is a region positioned between the first vibration arm forming region Q2 and the second vibration arm forming region Q3. The inter-element region Q5 is a region positioned between the adjacent vibration substrates 2.

The first vibration arm forming region Q2 and the second vibration arm forming region Q3 include a groove forming region Q1 in which the grooves 221 and 231 are formed, and a bank portion forming region Qd1 in which the bank portions 225 and 235 are formed. In other words, the bank portion forming region Qd1 corresponds to a region of the first vibration arm forming region Q2 and the second vibration arm forming region Q3 excluding the groove forming region Q1.

The thickness of the protective film 5 along the Z direction satisfies the relationship of T1<T2<T3, in which T1 is a thickness of the protective film 5 along the Z direction in the inter-arm region Q4, T2 is a thickness of the protective film 5 along the Z direction in the groove forming region Q1, and T3 is a thickness of the protective film 5 along the Z direction in the bank portion forming region Qd1.

In addition, the thickness of the protective film 5 along the Z direction satisfies a relationship of T11<T2<T3, in which T11 is a thickness of the protective film 5 along the Z direction in the inter-element region Q5. The protective film 5 in the inter-element region Q5 is formed in the same manner as the protective film 5 in the inter-arm region Q4, and the thickness T11 of the protective film 5 along the Z direction in the inter-element region Q5 is substantially equal to the thickness T1 of the protective film 5 along the Z direction in the inter-arm region Q4.

By forming the protective film 5 such that the thickness of the protective film 5 along the Z direction satisfies the relationship of T1<T2<T3, the etching depth of the crystal substrate 20 in the inter-arm region Q4 is deeper than the etching depth of the crystal substrate 20 in the groove forming region Q1 in the dry etching step S3 described later. In addition, the etching depth of the crystal substrate 20 in the groove forming region Q1 is deeper than the etching depth of the crystal substrate 20 in the bank portion forming region Qd1.

Similarly, by forming the protective film 5 such that the thickness of the protective film 5 along the Z direction satisfies the relationship of T11<T2<T3, the etching depth of the crystal substrate 20 in the inter-element region Q5 is deeper than the etching depth of the crystal substrate 20 in the groove forming region Q1 in the dry etching step S3 described later. In addition, since the thickness T11 of the protective film 5 along the Z direction in the inter-element region Q5 is substantially equal to the thickness T1 of the protective film 5 along the Z direction in the inter-arm region Q4, the etching depth of the crystal substrate 20 in the inter-element region Q5 is substantially equal to the etching depth of the crystal substrate 20 in the inter-arm region Q4.

A method of forming the protective film 5 will be described in detail.

As shown in FIG. 6, in the present embodiment, the protective film forming step S2 includes an application step S21 of applying a protective material to the first substrate surface 20A of the crystal substrate 20, an exposure step S22 of exposing the protective material applied to the first substrate surface 20A, and a development step S23 of developing the protective material applied to the first substrate surface 20A. According to such a method, the protective film 5 can be easily formed.

Figure 7:
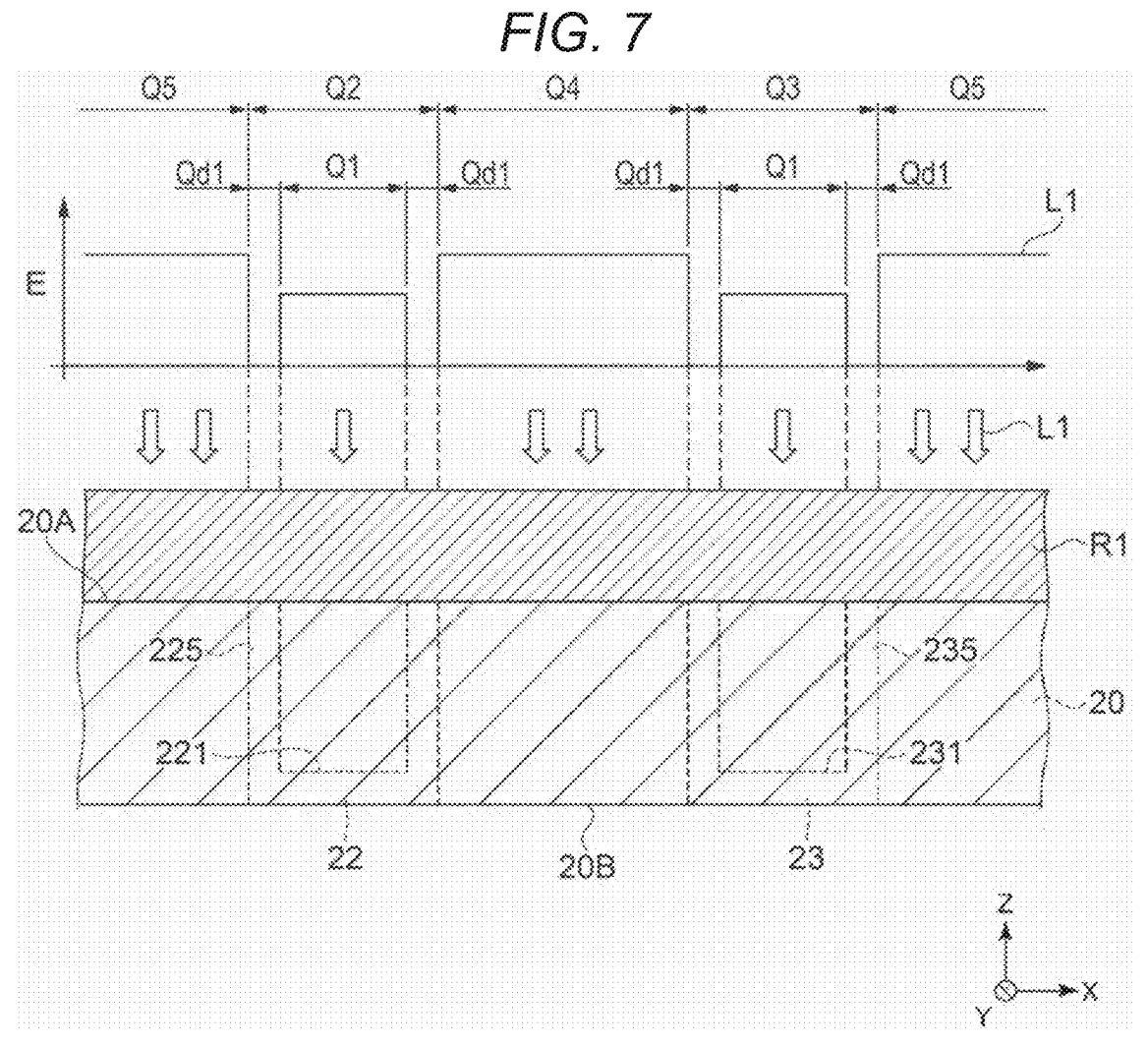

As shown in FIG. 7, in the application step S21, a resist material R1, which is the protective material, is applied to the first substrate surface 20A of the crystal substrate 20 with a predetermined thickness. In the present embodiment, the resist material R1 is a positive photoresist. The resist material R1 may be a negative photoresist. As a method of applying the resist material R1, for example, a spin coating method, a spray coating method, or the like can be used.

Next, in the exposure step S22, the resist material R1 applied to the first substrate surface 20A of the crystal substrate 20 is irradiated with an electromagnetic wave L1. The electromagnetic wave L1 is emitted to the resist material R1 at an exposure intensity E corresponding to each region of the inter-arm region Q4, the groove forming region Q1, the bank portion forming region Qd1, and the inter-element region Q5. FIG. 7 shows an example of a distribution of the exposure intensity E of the electromagnetic wave L1 in the X direction. The exposure intensity E of the electromagnetic wave L1 can be changed using a filter, a gray scale mask, or the like.

Next, in the development step S23, the resist material R1 applied to the first substrate surface 20A of the crystal substrate 20 is developed. Accordingly, the protective film 5 shown in FIG. 5 is formed. The thickness of the protective film 5 along the Z direction corresponds to the exposure intensity E of the electromagnetic wave L1 emitted to the resist material R1 in the exposure step S22.

In the present embodiment, the protective film 5 is a resist film formed of the resist material R1. Since the resist material R1 can be used as the protective film 5 as it is by using the protective film 5 as a resist film, the protective film forming step S2 can be simplified.

The method of forming the protective film 5 is not limited to the above-described method.

In addition, the protective material for forming the protective film 5 may be a material other than the resist material R1. For example, the protective material may be a metal such as nickel, copper, or chromium. That is, the protective film 5 may be a metal film formed of a metal. Such a metal film can be formed by, for example, a plating method. In general, an etching rate of the metal is lower than an etching rate of the photoresist used for the resist material R1. Therefore, by using the metal film as the protective film 5, the thickness of the protective film 5 along the Z direction can be made thinner than that of the resist film. Accordingly, the dimensional accuracy of the first and second vibration arms 22 and 23, the grooves 221 and 231, or the like formed in the dry etching step S3 can be improved.

Dry Etching Step S3

Figure 8:
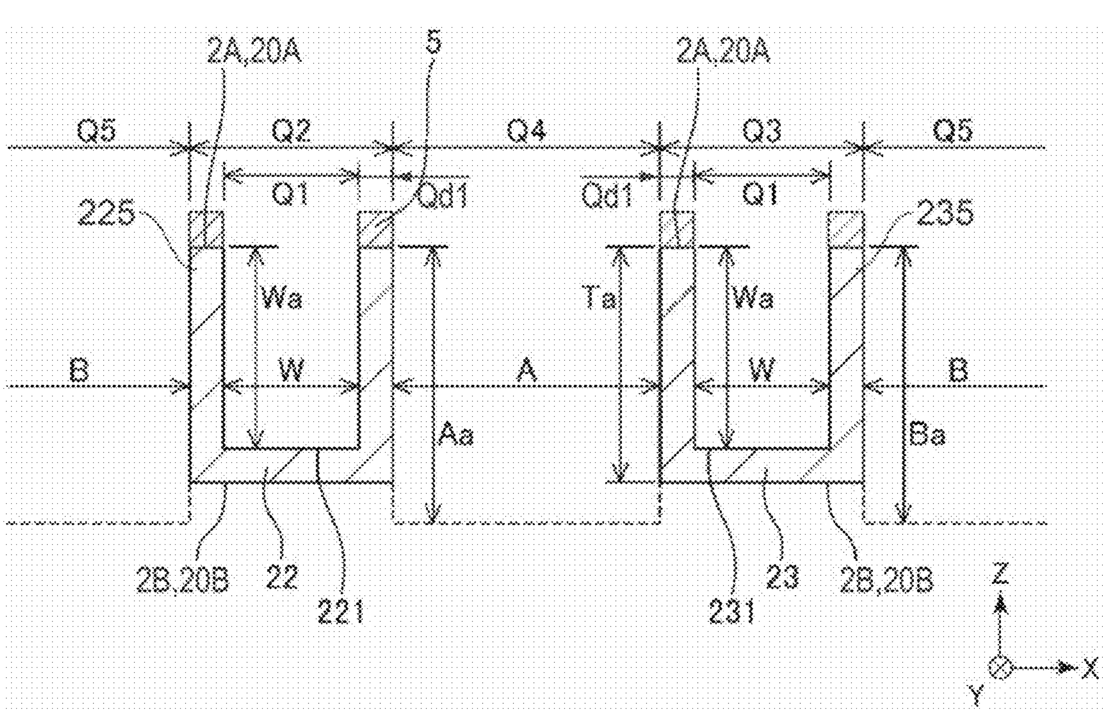
FIG. 8 is a cross-sectional view showing the method of manufacturing the vibration element.

As shown in FIG. 8, the crystal substrate 20 is dry-etched from the side on the first substrate surface 20A via the protective film 5, and the grooves 221 and 231 and the outer shape of the vibration substrate 2 are simultaneously formed. The outer shape of the vibration substrate 2 includes the outer shapes of the first and second vibration arms 22 and 23. The term "simultaneously formed" means that the grooves 221 and 231 and the outer shape of the vibration substrate 2 are collectively formed in one step. More specifically, the step is reactive ion etching, and is performed by using a reactive ion etching device (RIE device). In addition, reaction gas introduced into the RIE device is not particularly limited, and for example, $SF_6$, $CF_4$, $C_2F_4$, $C_2F_6$, $C_3F_6$, $C_4F_8$, or the like can be used.

In the dry etching step S3, the protective film 5 formed on the first substrate surface 20A of the crystal substrate 20 is etched at a predetermined etching rate. Then, by removing the protective film 5, the first substrate surface 20A of the crystal substrate 20 is exposed, and etching of the crystal substrate 20 is started. Therefore, in the region in which the thickness of the protective film 5 along the Z direction is thin, the start of the etching on the first substrate surface 20A of the crystal substrate 20 is earlier, and the etching depth of the crystal substrate 20 is deeper. In addition, in the region in which the thickness of the protective film 5 along the Z direction is thick, the start of etching on the first substrate surface 20A of the crystal substrate 20 is later, and the etching depth of the crystal substrate 20 is shallower. In addition, by sufficiently increasing the thickness of the protective film 5 along the Z direction, the dry etching step S3 can be terminated in a state where the protective film 5 remains on the first substrate surface 20A of the crystal substrate 20, and the crystal substrate 20 can be prevented from being etched. In this way, the etching depth of the crystal substrate 20 can be controlled by adjusting the thickness of the protective film 5 along the Z direction.

The dry etching step S3 is terminated when the grooves 221 and 231 have a desired depth. The etching depth of the crystal substrate 20 in the groove forming region Q1 is a depth Wa of the grooves 221 and 231. The etching depth of the crystal substrate 20 in the inter-arm region Q4 is a depth Aa of the outer shape of the vibration substrate 2. The etching depth of the crystal substrate 20 in the inter-element region Q5 is a depth Ba of the outer shape of the vibration substrate 2.

As described above, the thickness T1 of the protective film 5 along the Z direction in the inter-arm region Q4 and the thickness T11 of the protective film 5 along the Z direction in the inter-element region Q5 are thinner than the thickness T2 of the protective film 5 along the Z direction in the groove forming region Q1. That is, T1<T2 and T11<T2. Therefore, the depths Aa and Ba of the outer shape of the vibration substrate 2 are deeper than the depth Wa of the grooves 221 and 231. That is, Wa<Aa and Wa<Ba. In addition, each of the depths Aa and Ba is equal to or larger than a thickness Ta of the crystal substrate 20 along the Z direction. That is, Aa≥Ta and Ba≥Ta. By setting the depths Aa and Ba to be equal to or larger than the thickness Ta of the crystal substrate 20 along the Z direction, the inter-arm region Q4 and the inter-element region Q5 are respectively penetrated in the dry etching step S3. The first vibration arm 22 and the second vibration arm 23 are formed by penetrating the inter-arm region Q4 and the inter-element region Q5, respectively.

In addition, as described above, the thickness T2 of the protective film 5 along the Z direction in the groove forming region Q1 is smaller than the thickness T3 of the protective film 5 along the Z direction in the bank portion forming region Qd1. That is, T2<T3. Therefore, the depth Wa of the grooves 221 and 231 is deeper than the etching depth of the crystal substrate 20 in the bank portion forming region Qd1.

In this way, by forming the protective film 5 such that the thickness of the protective film 5 along the Z direction satisfies the relationship of T1<T2<T3 and T11<T2<T3, the outer shapes of the first and second vibration arms 22 and 23 and the grooves 221 and 231 can be collectively formed without using the micro-loading effect in the dry etching step S3. Since dimensions of the first and second vibration arms 22 and 23, the grooves 221 and 231, and the like can be controlled by the thickness of the protective film 5 along the Z direction, there is no restriction on the setting of the dimensions such as a width A in the X direction in the inter-arm region Q4, a width B in the X direction in the inter-element region Q5, and a width W in the X direction in the grooves 221 and 231, and the degree of freedom in design of the vibration element 1 can be improved.

In addition, since the micro-loading effect is not used, restrictions on dry etching conditions such as selection of reaction gas used for dry etching are relaxed, and thus the vibration element 1 can be easily manufactured as compared with a case where the micro-loading effect is used.

In addition, as described above, in the present embodiment, the protective film 5 is formed in the first vibration arm forming region Q2, the second vibration arm forming region Q3, the inter-arm region Q4, and the inter-element region Q5. In other words, the thickness T1 of the protective film 5 along the Z direction in the inter-arm region Q4 and the thickness T11 of the protective film 5 along the Z direction in the inter-element region Q5 satisfy 0<T1 and 0<T11.

For example, when the thickness of the resist material R1 along the Z direction varies in the application step S21, the thickness T2 of the protective film 5 along the Z direction in the groove forming region Q1, the thickness T1 of the protective film 5 along the Z direction in the inter-arm region Q4, and the thickness T11 of the protective film 5 along the Z direction in the inter-element region Q5 vary according to the variation of the thickness of the resist material R1 along the Z direction. However, even when the thickness of the resist material R1 along the Z direction varies, a difference between the thicknesses T1 and T11 of the protective film 5 along the Z direction in the inter-arm region Q4 and the inter-element region Q5 and the thickness T2 of the protective film 5 along the Z direction in the groove forming region Q1 is kept substantially constant. That is, a time difference between a time at which the etching of the first substrate surface 20A of the crystal substrate 20 is started in the inter-arm region Q4 and the inter-element region Q5 and a time at which the etching of the first substrate surface 20A of the crystal substrate 20 is started in the groove forming region Q1 is substantially constant. Therefore, since a difference between the depths Aa and Ba of the outer shape of the vibration substrate 2 and the depth Wa of the grooves 221 and 231 can be set to a substantially constant depth, it is possible to easily control the depth Wa of the grooves 221 and 231. In this way, by forming the protective film 5 in the first vibration arm forming region Q2, the second vibration arm forming region Q3, the inter-arm region Q4, and the inter-element region Q5, it is possible to easily control the depth Wa of the grooves 221 and 231.

In addition, in the present embodiment, the thickness T3 of the protective film 5 along the Z direction in the bank portion forming region Qd1 is sufficiently increased, and therefore, in the dry etching step S3, the dry etching is terminated in a state where the protective film 5 remains on the first substrate surface 20A of the crystal substrate 20 in the bank portion forming region Qd1. That is, the first substrate surface 20A of the crystal substrate 20 in the bank portion forming region Qd1 is not etched in the dry etching step S3. The first substrate surface 20A of the crystal substrate 20 in the bank portion forming region Qd1 is the first surface 2A of the first and second vibration arms 22 and 23 in the protective film removing step S4 described later.

By adjusting the thickness T3 of the protective film 5 along the Z direction in the bank portion forming region Qd1, in the dry etching step S3, the dry etching may be terminated in a state where the protective film 5 does not remain on the first substrate surface 20A of the crystal substrate 20 in the bank portion forming region Qd1. That is, the first substrate surface 20A of the crystal substrate 20 in the bank portion forming region Qd1 may be etched in the dry etching step S3. In this case, an upper surface of the crystal substrate 20 in the bank portion forming region Qd1 etched in the dry etching step S3 is the first surface 2A of the first and second vibration arms 22 and 23.

In this way, in the dry etching step S3, the first surface 2A of the first and second vibration arms 22 and 23, the grooves 221 and 231, and the outer shapes of the first and second vibration arms 22 and 23 are formed.

Protective Film Removing Step S4

Figure 9:
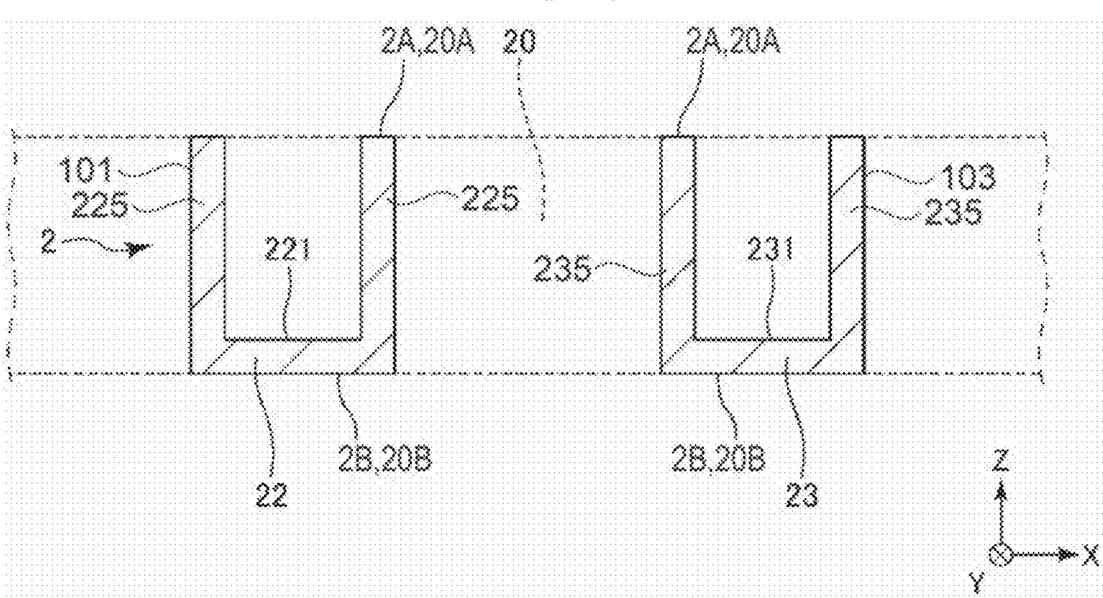
FIG. 9 is a cross-sectional view showing the method of manufacturing the vibration element.

As shown in FIG. 9, the protective film 5 remaining on the first substrate surface 20A of the crystal substrate 20 in the bank portion forming region Qd1 is removed. Accordingly, the first substrate surface 20A of the crystal substrate 20 is the first surface 2A of the first and second vibration arms 22 and 23. That is, since the first surface 2A of the first and second vibration arms 22 and 23 is not etched in the dry etching step S3, the thickness of the first and second vibration arms 22 and 23 and a surface roughness of the first surface 2A in the bank portion forming region Qd1 are maintained as the thickness of the crystal substrate 20 and a surface roughness of the first substrate surface 20A. Therefore, the thickness accuracy of the first and second vibration arms 22 and 23 is improved, and the occurrence of unnecessary vibration such as torsional vibration is prevented.

In the dry etching step S3 described above, when the dry etching is terminated in the state where the protective film 5 does not remain on the first substrate surface 20A of the crystal substrate 20, the protective film removing step S4 may not be provided.

By the above steps S1 to S4, as shown in FIG. 9, a plurality of vibration substrates 2 are collectively formed from the crystal substrate 20.

Electrode Forming Step S5

A metal film is formed on the surface of the vibration substrate 2, and the metal film is patterned to form the electrode 3.

As described above, the vibration element 1 is obtained.

As described above, according to the dry etching, processing can be performed without being affected by crystal surfaces of the crystal, and thus excellent dimensional accuracy can be achieved. In addition, by collectively forming the grooves 221 and 231 and the outer shape of the vibration substrate 2, it is possible to reduce the number of manufacturing steps of the vibration element 1 and to reduce the cost of the vibration element 1. In addition, positional deviation of the grooves 221 and 231 with respect to the outer shape is prevented, and the forming accuracy of the vibration substrate 2 is improved.

The method of manufacturing the vibration element 1 is described above. However, the present disclosure is not limited thereto. A configuration of each part can be replaced with any configuration having the same function. In addition, any other constituents may be added to the present disclosure.

For example, the vibration element 1 may further include a bottomed groove that opens to the second surface 2B in addition to the bottomed grooves 221 and 231 that open to the first surface 2A of the first vibration arm 22 and the second vibration arm 23. That is, the method of manufacturing the vibration element 1 can also be applied to a vibration element having bottomed grooves on the first surface 2A and the second surface 2B of the first vibration arm 22 and the second vibration arm 23, respectively.

As described above, according to the present embodiment, the following effects can be obtained.

The vibration element 1 includes the first vibration arm 22 and the second vibration arm 23 extending along the Y direction which is the first direction and arranged side by side along the X direction which is the second direction intersecting the Y direction. The first vibration arm 22 and the second vibration arm 23 are arranged side by side in the Z direction which is the third direction intersecting the Y direction and the X direction, and respectively have the first surface 2A and the second surface 2B in the front and back relationship, and the bottomed grooves 221 and 231 opening to the first surface 2A. The method of manufacturing the vibration element 1 includes: the preparation step S1 of preparing the crystal substrate 20 having the first substrate surface 20A and the second substrate surface 20B in the front and back relationship; the protective film forming step S2 of forming the protective film 5 on the first substrate surface 20A; and the dry etching step S3 of dry-etching the crystal substrate 20 from the side on the first substrate surface 20A via the protective film 5 to form the first surface 2A, the grooves 221 and 231, and the outer shapes of the first vibration arm 22 and the second vibration arm 23. The protective film 5 satisfies the relationship of T1<T2<T3, in which T1 is the thickness of the protective film 5 along the Z direction in the inter-arm region Q4 positioned between the first vibration arm forming region Q2 in which the first vibration arm 22 is formed and the second vibration arm forming region Q3 in which the second vibration arm 23 is formed, T2 is the thickness of the protective film 5 along the Z direction in the groove forming region Q1 in which the grooves 221 and 231 are formed, and T3 is the thickness of the protective film 5 along the Z direction in the region Qd1 of the first vibration arm forming region Q2 and the second vibration arm forming region Q3 excluding the groove forming region Q1. Accordingly, the outer shapes of the first and second vibration arms 22 and 23 and the grooves 221 and 231 can be collectively formed, and there is no restriction on the setting of the dimensions such as the width A in the X direction in the inter-arm region Q4, the width B in the X direction in the inter-element region Q5, and the width W in the X direction in the grooves 221 and 231, and it is possible to provide a method of manufacturing the vibration element 1 having a high degree of freedom in design.

2. Second Embodiment

A method of manufacturing the vibration element 1 according to a second embodiment will be described with reference to FIG. 10. The same components as those of the first embodiment are denoted by the same reference numerals, and redundant description thereof will be omitted.

The second embodiment is the same as the first embodiment except that T1=0 and T11=0 in the protective film 5.

Since the preparation step S1 is the same as that of the first embodiment, the description thereof will be omitted, and the protective film forming step S2 will be described.

Protective Film Forming Step S2

Figure 10:
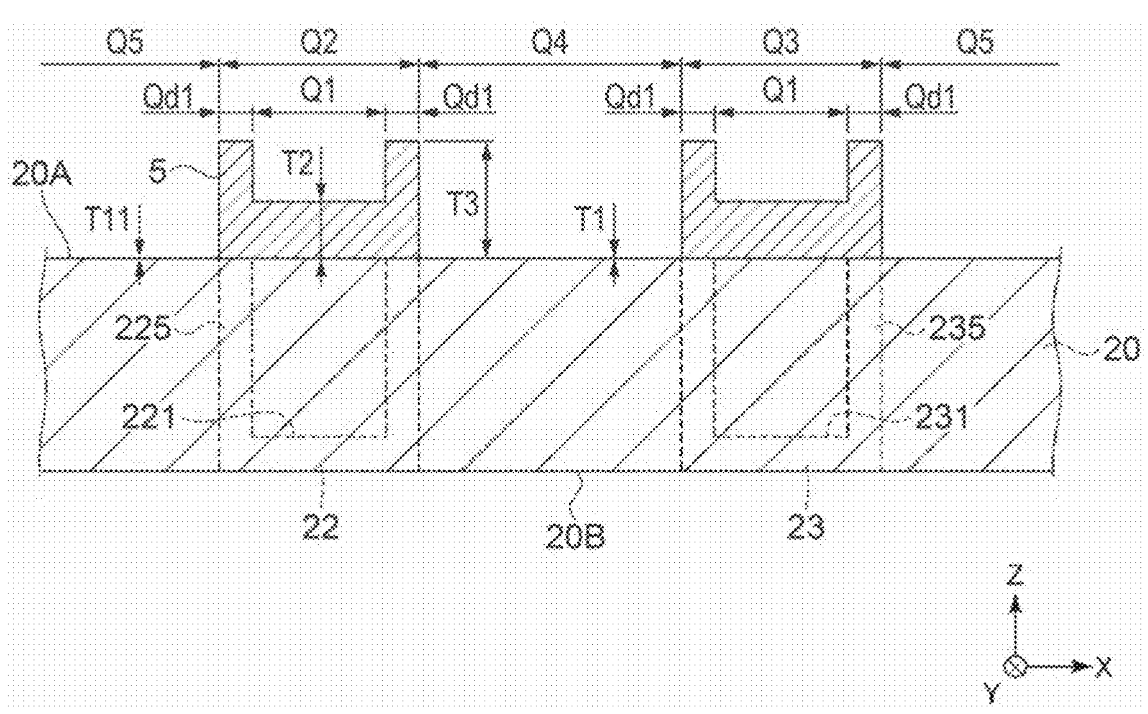
FIG. 10 is a cross-sectional view showing a method of manufacturing a vibration element according to a second embodiment.

As shown in FIG. 10, the protective film 5 is formed on the first substrate surface 20A of the crystal substrate 20.

The thickness of the protective film 5 along the Z direction satisfies the relationship of T1<T2<T3 and T11<T2<T3.

However, in the present embodiment, the protective film 5 is formed in the first vibration arm forming region Q2 and the second vibration arm forming region Q3, but is not formed in the inter-arm region Q4 and the inter-element region Q5. That is, in the protective film 5, T1=0 and T11=0.

Dry Etching Step S3

The crystal substrate 20 is dry-etched from the side on the first substrate surface 20A via the protective film 5, and the grooves 221 and 231 and the outer shape of the vibration substrate 2 are simultaneously formed.

Since the protective film 5 is not formed in the inter-arm region Q4 and the inter-element region Q5, the etching of the crystal substrate 20 in the inter-arm region Q4 and the inter-element region Q5 is started together with the start of the dry etching in the dry etching step S3. Therefore, the dry etching step S3 can be performed in a shorter time.

When the dry etching step S3 is terminated, the process proceeds to the protective film removing step S4. Since the protective film removing step S4 and the electrode forming step S5 are the same as those of the first embodiment, the description thereof will be omitted.

According to the present embodiment, the following effects can be obtained in addition to the effects of the first embodiment.

By setting T1=0 in the protective film 5, the inter-arm region Q4 can be etched in a shorter time.

The method of manufacturing the vibration element according to the present disclosure has been described above based on the first and second embodiments.

A vibration element manufactured by the method of manufacturing the vibration element according to the present disclosure is not particularly limited.

Figure 11:
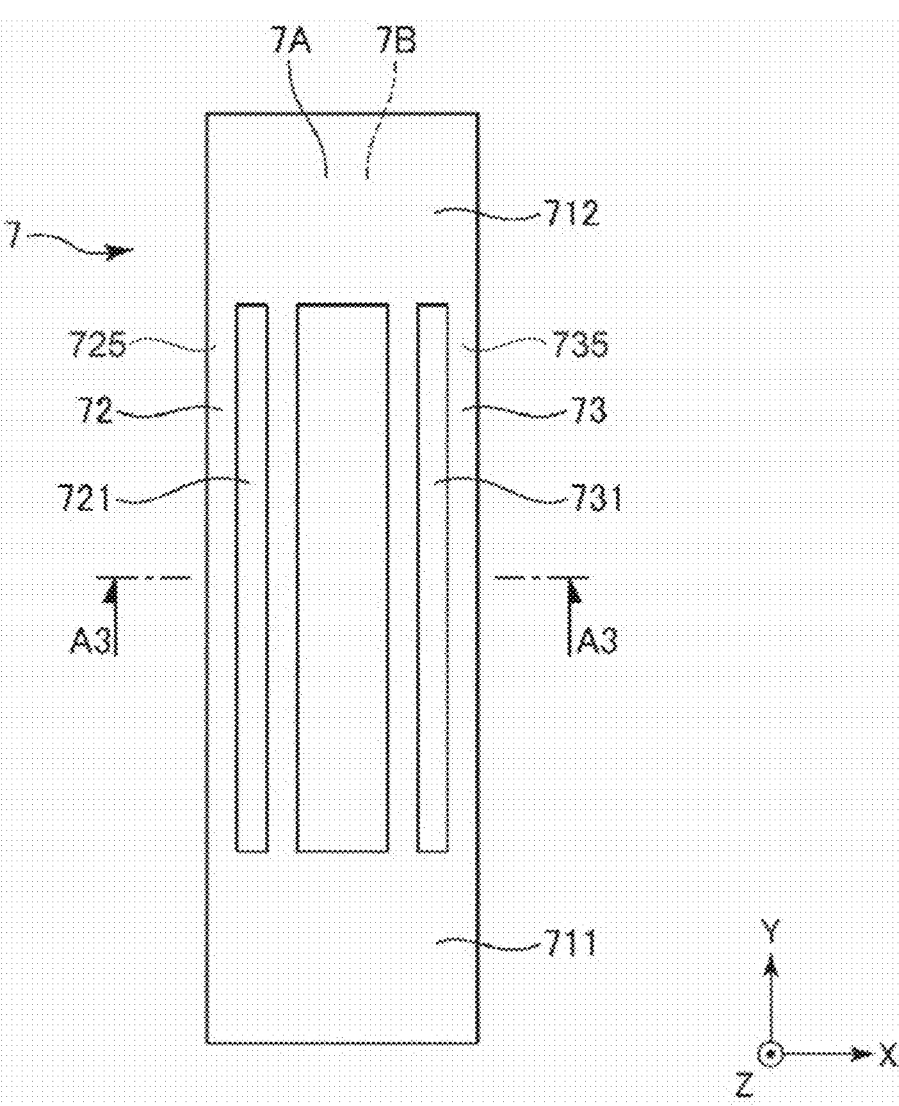
FIG. 11 is a plan view showing a modification of the vibration element.
Figure 12:
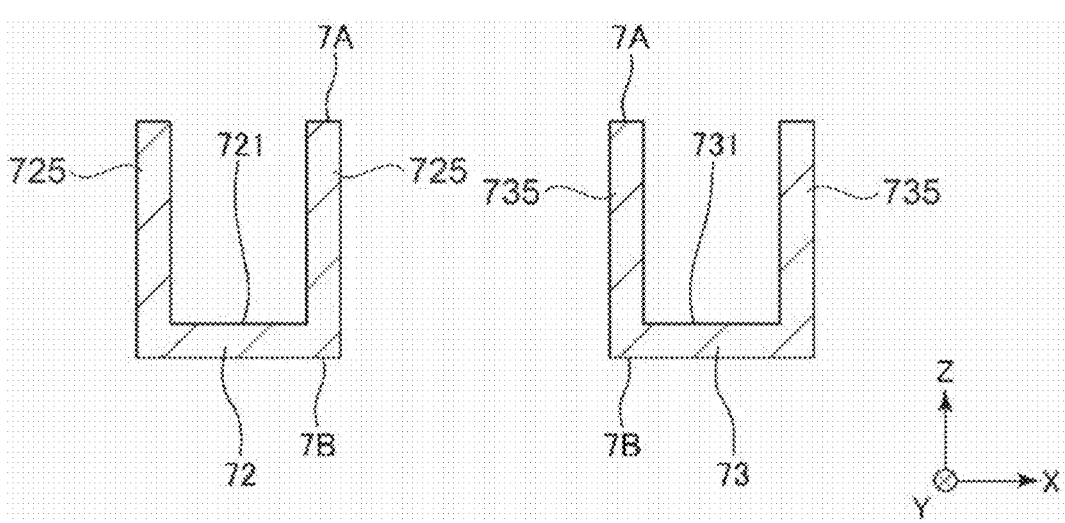
FIG. 12 is a cross-sectional view taken along a line A3-A3 in FIG. 11.

The vibration element manufactured by the method of manufacturing the vibration element according to the present disclosure may be, for example, a double tuning-fork type vibration element 7 as shown in FIGS. 11 and 12. In FIGS. 11 and 12, the electrodes are not shown. The double tuning-fork type vibration element 7 includes a pair of base portions 711 and 712, and a first vibration arm 72 and a second vibration arm 73 that couple the base portions 711 and 712. The first vibration arm 72 and the second vibration arm 73 have a first surface 7A and a second surface 7B in a front and back relationship. In addition, the first vibration arm 72 and the second vibration arm 73 respectively include bottomed grooves 721 and 731 that open to the first surface 7A, and bank portions 725 and 735 that define the grooves 721 and 731.

Figure 13:
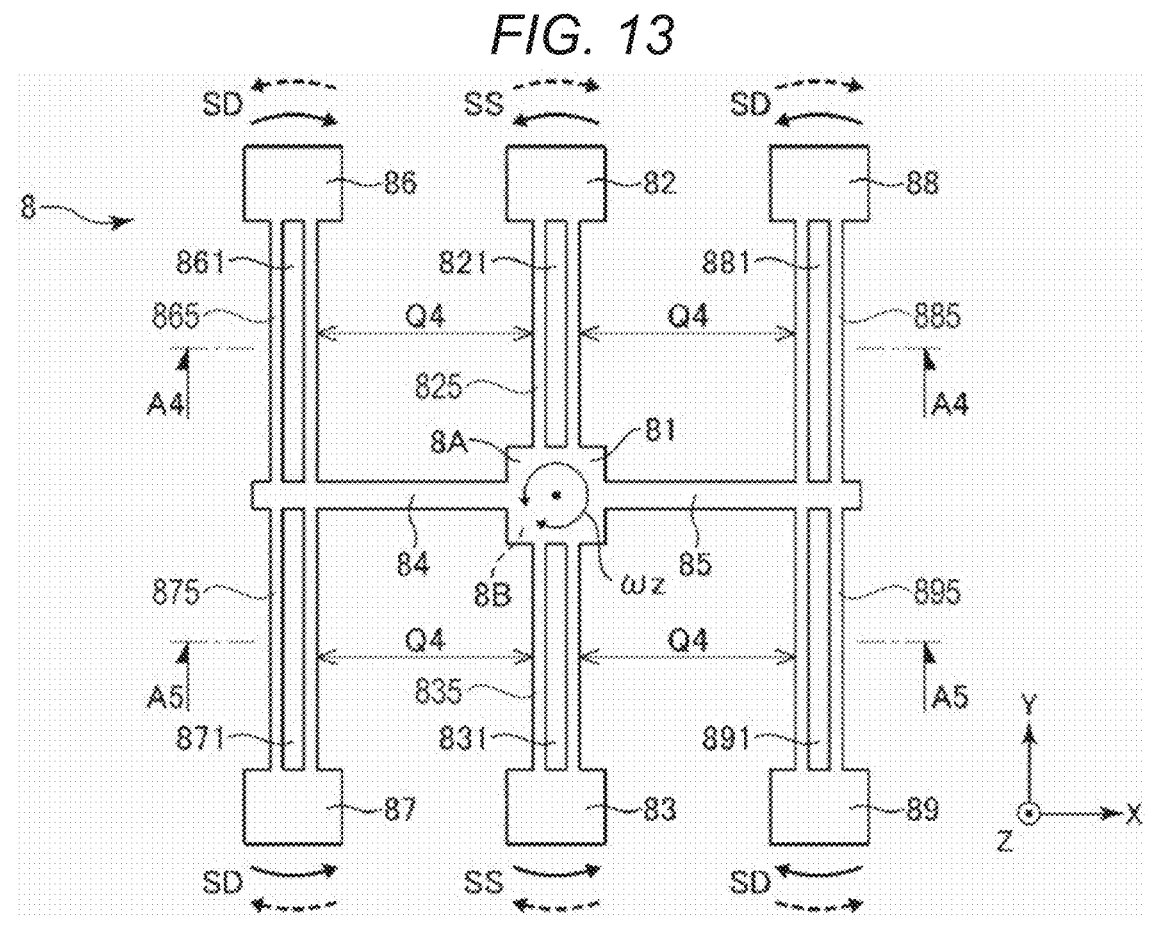
Figure 14:
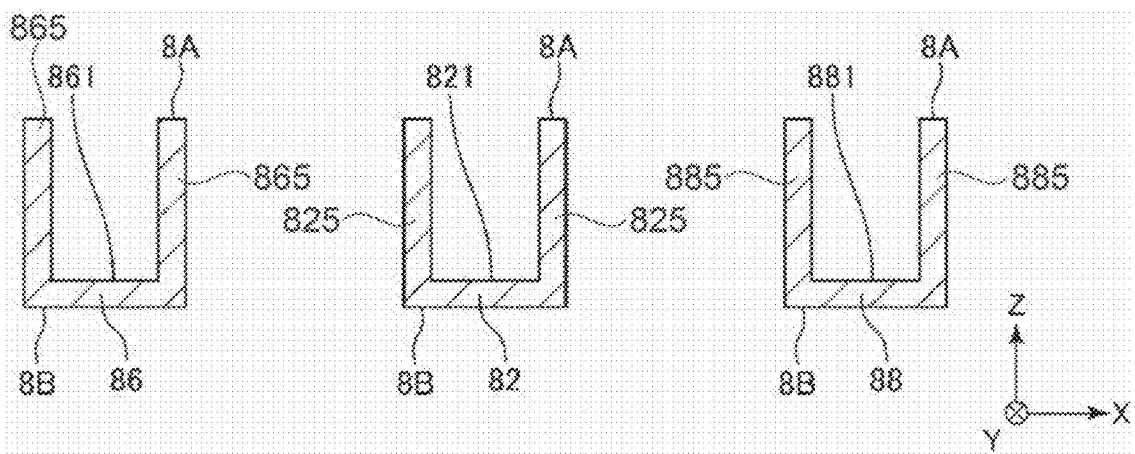
FIG. 14 is a cross-sectional view taken along a line A4-A4 in FIG. 13.
Figure 15:
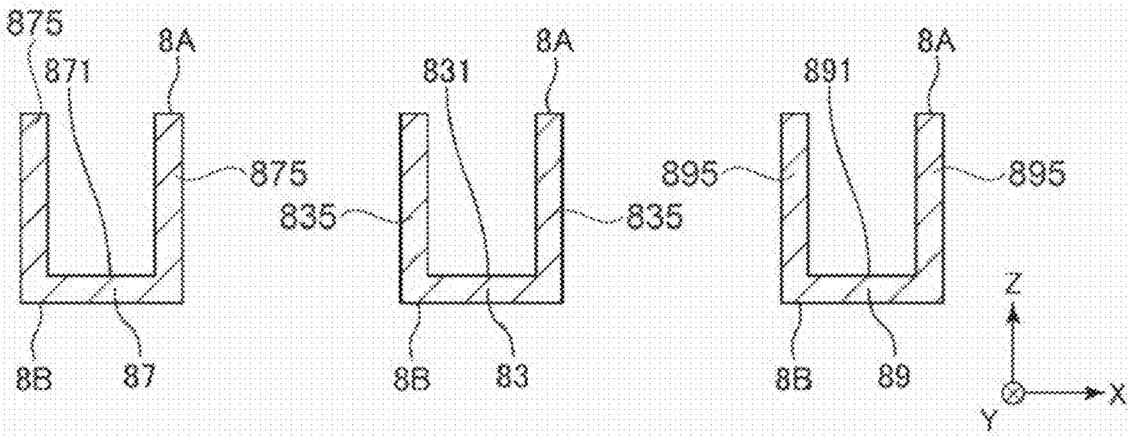
FIG. 15 is a cross-sectional view taken along a line A5-A5 in FIG. 13.

In addition, for example, the vibration element may be a gyro vibration element 8 as shown in FIGS. 13, 14, and 15. In FIGS. 13, 14, and 15, the electrodes are not shown. The gyro vibration element 8 includes a base portion 81, a pair of detection vibration arms 82 and 83 extending from the base portion 81 to both sides in the Y direction, a pair of coupling arms 84 and 85 extending from the base portion 81 to both sides in the X direction, drive vibration arms 86 and 87 extending from a tip end portion of the coupling arm 84 to both sides in the Y direction, and drive vibration arms 88 and 89 extending from a tip end portion of the coupling arm 85 to both sides in the Y direction. In such a gyro vibration element 8, when an angular velocity ωz around the Z axis acts in a state where the drive vibration arms 86, 87, 88, and 89 are caused to perform flexural vibration in a direction of an arrow SD in FIG. 13, flexural vibration in a direction of an arrow SS is newly excited in the detection vibration arms 82 and 83 by the Coriolis force, and the angular velocity ωz is detected based on electric charges output from the detection vibration arms 82 and 83 by the flexural vibration.

The detection vibration arms 82 and 83 and the drive vibration arms 86, 87, 88, and 89 have a first surface 8A and a second surface 8B in a front and back relationship. In addition, the detection vibration arms 82 and 83 include bottomed grooves 821 and 831 that open to the first surface 8A, and bank portions 825 and 835 that define the grooves 821 and 831. In addition, the drive vibration arms 86, 87, 88, and 89 have bottomed grooves 861, 871, 881, and 891 that open to the first surface 8A, and bank portions 865, 875, 885, and 895 that define the grooves 861, 871, 881, and 891. In such a gyro vibration element 8, for example, the drive vibration arms 86 and 88 or the drive vibration arms 87 and 89 are the first vibration arm and the second vibration arm.

Figure 16:
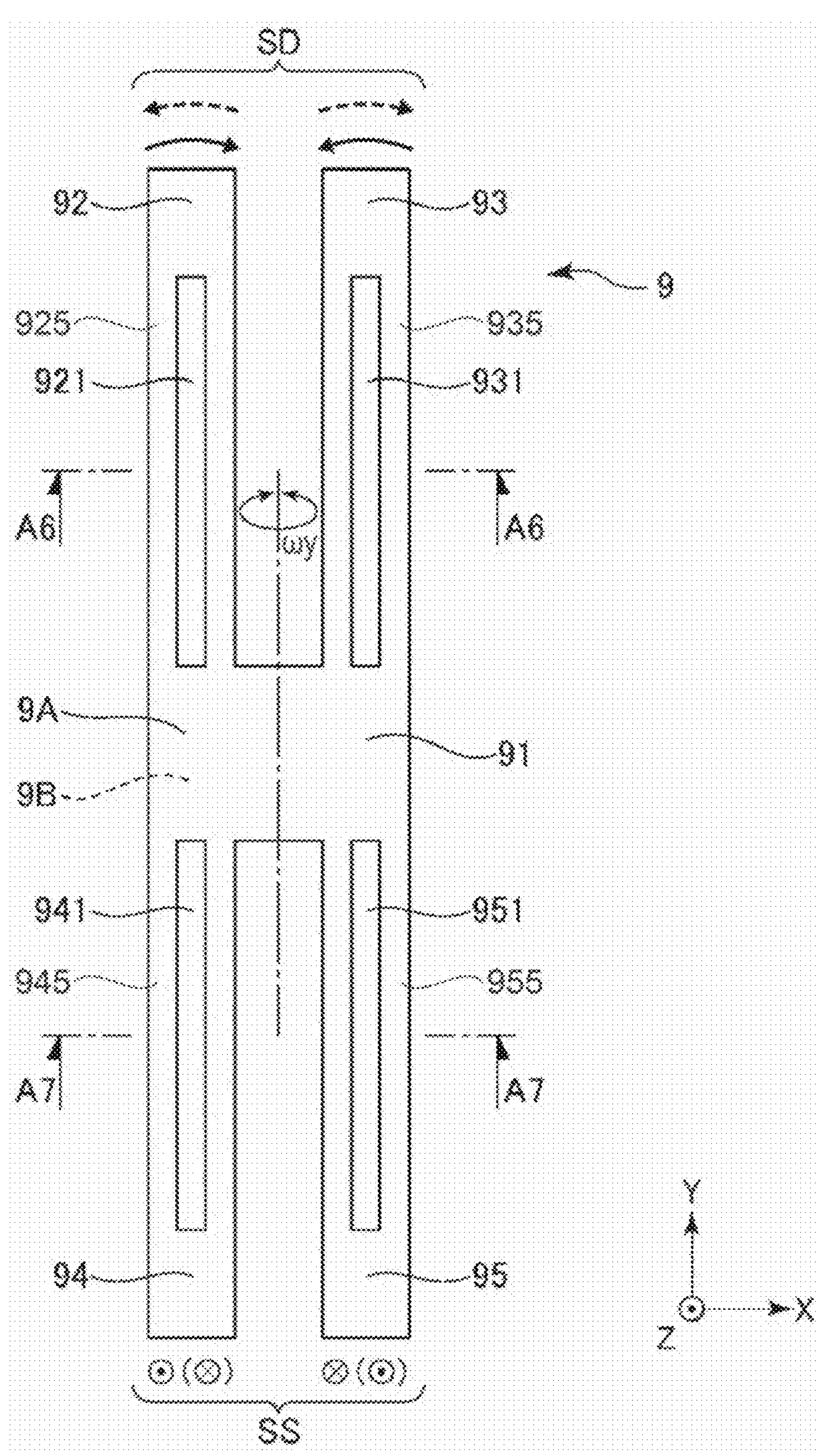
FIG. 16 is a plan view showing a modification of the vibration element.
Figure 17:
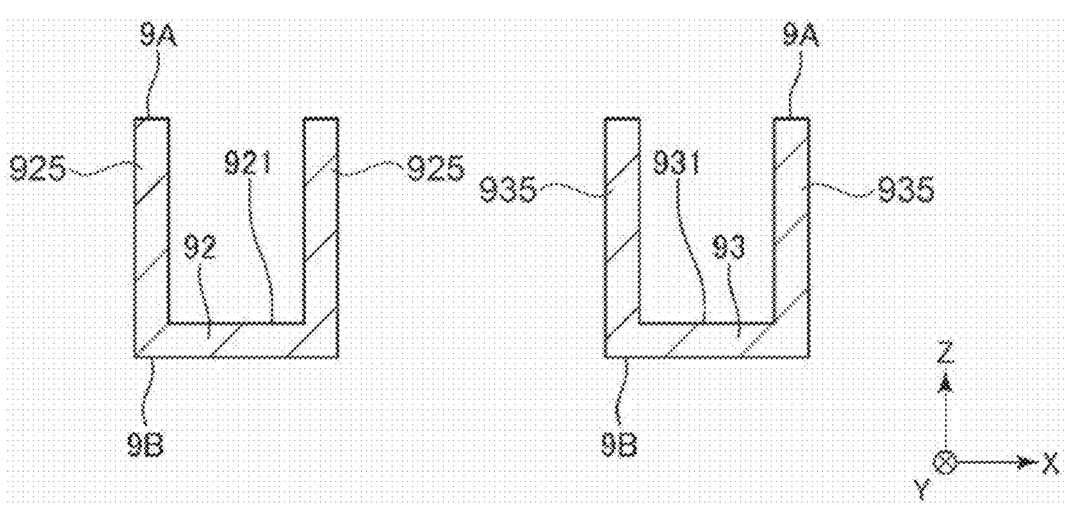
FIG. 17 is a cross-sectional view taken along a line A6-A6 in FIG. 16.
Figure 18:
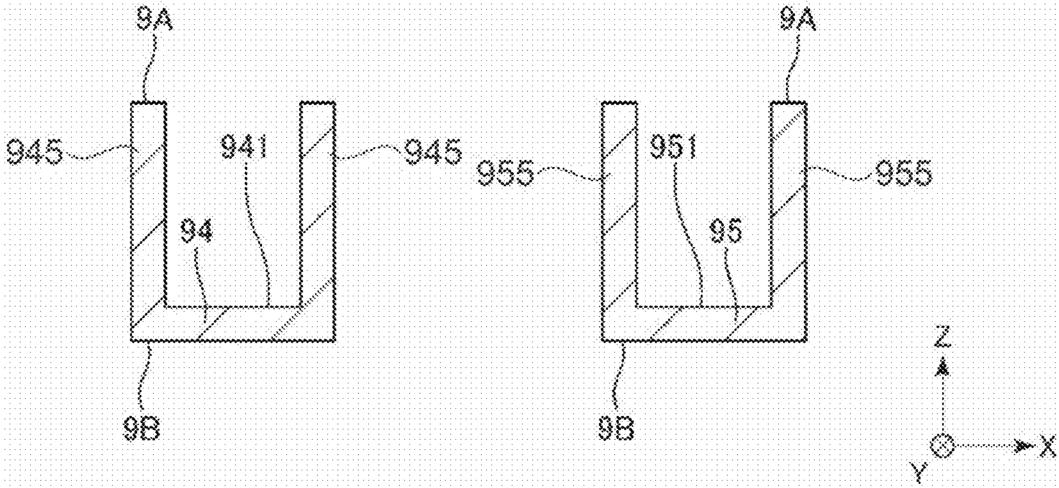
FIG. 18 is a cross-sectional view taken along a line A7-A7 in FIG. 16.

In addition, for example, the vibration element may be a gyro vibration element 9 as shown in FIGS. 16, 17, and 18. In FIGS. 16, 17, and 18, the electrodes are not shown. The gyro vibration element 9 includes a base portion 91, a pair of drive vibration arms 92 and 93 extending from the base portion 91 to the plus side in the Y direction and arranged side by side in the X direction, and a pair of detection vibration arms 94 and 95 extending from the base portion 91 to the minus side in the Y direction and arranged side by side in the X direction. In such a gyro vibration element 9, when an angular velocity ωy around the Y axis acts in a state where the drive vibration arms 92 and 93 are caused to perform flexural vibration in the direction of the arrow SD in FIG. 16, flexural vibration in the direction of the arrow SS is newly excited in the detection vibration arms 94 and 95 by the Coriolis force, and the angular velocity coy is detected based on electric charges output from the detection vibration arms 94 and 95 by the flexural vibration.

The drive vibration arms 92 and 93 and the detection vibration arms 94 and 95 have a first surface 9A and a second surface 9B in a front and back relationship. In addition, the drive vibration arms 92 and 93 include bottomed grooves 921 and 931 that open to the first surface 9A, and bank portions 925 and 935 that define the grooves 921 and 931. In addition, the detection vibration arms 94 and 95 include bottomed grooves 941 and 951 that open to the first surface 9A, and bank portions 945 and 955 that define the grooves 941 and 951. In such a gyro vibration element 9, the drive vibration arms 92 and 93 or the detection vibration arms 94 and 95 are the first vibration arm and the second vibration arm.

What is claimed is:

1. A method of manufacturing a vibration element comprising a crystal substrate and including a first vibration arm and a second vibration arm extending along a first direction and arranged side by side along a second direction intersecting the first direction, the first vibration arm and the second vibration arm each having a first surface and a second surface in a front and back relationship that are arranged side by side in a third direction intersecting the first direction and the second direction, and a bottomed groove opening to the first surface, and electrodes provided on each of the first vibration arm and the second vibration arm that through application of a drive signal thereto cause the first vibration arm and the second vibration arm to vibrate, the method comprising:

providing the crystal substrate having a first substrate surface and a second substrate surface in a front and back relationship;

forming a protective film on the first substrate surface; and dry-etching the protective film and the first substrate surface of the crystal substrate in a single dry-etching step, simultaneously forming the first surface, the bottomed groove, and outer shapes of the first vibration arm and the second vibration arm, wherein the forming of the protective film includes applying a protective material to the first substrate surface, exposing the protective material, and developing the protective material such that $T1<T2<T3$, and the forming of the protective film such that $T1<T2<T3$ is satisfied is conducted before the single dry-etching step of the first substrate surface of the crystal substrate, wherein T1 is a thickness of the protective film along the third direction in an inter-arm region positioned between a first vibration arm forming region in which the first vibration arm is formed and a second vibration arm forming region in which the second vibration arm is formed, T2 is a thickness of the protective film along the third direction in a groove forming region in which the groove is formed, and T3 is a thickness of the protective film along the third direction in a region of the first vibration arm forming region and the second vibration arm forming region excluding the groove forming region.

2. The method of manufacturing a vibration element according to claim 1, wherein in the protective film, T1=0.

3. The method of manufacturing a vibration element according to claim 1, wherein the dry etching is terminated in a state where the protective film remains on the first substrate surface, and the method of manufacturing a vibration element further comprises removing the remaining protective film.

4. The method of manufacturing a vibration element according to claim 1, wherein the protective film is a resist film.

5. The method of manufacturing a vibration element according to claim 1, wherein the protective film is a metal film.

6. The method of manufacturing a vibration element according to claim 1, wherein the single dry-etching step simultaneously forms an entirety of the first surface, an entirety of the bottomed groove, and an entirety of the outer shapes of the first vibration arm and the second vibration arm.

7. The method of manufacturing a vibration element according to claim 1, wherein T1 is a thickness of the protective film that is present along the third direction in an inter-arm region positioned between a first vibration arm forming region in which the first vibration arm is formed and a second vibration arm forming region in which the second vibration arm is formed.

* * * * *